United States Patent [19]

Maki et al.

[11] Patent Number: 5,744,855
[45] Date of Patent: Apr. 28, 1998

[54] SINGLE-POLY-TYPE BIPOLAR TRANSISTOR

[75] Inventors: Yukio Maki; Hiroki Honda, both of Hyogo, Japan

[73] Assignee: Mitsubishi Denki Kabushiki Kaisha, Tokyo, Japan

[21] Appl. No.: 460,940

[22] Filed: Jun. 5, 1995

[30] Foreign Application Priority Data

Dec. 2, 1994 [JP] Japan ................... 6-299361

[51] Int. Cl.$^6$ ............... H01L 27/082; H01L 27/102; H01L 29/70; H01L 31/11
[52] U.S. Cl. ............... 257/588; 257/370; 257/592
[58] Field of Search ............... 257/370, 378, 257/565, 586, 588, 622, 592

[56] References Cited

U.S. PATENT DOCUMENTS

| | | | |
|---|---|---|---|
| 4,892,837 | 1/1990 | Kudo | 437/31 |
| 5,371,401 | 12/1994 | Kurita | 257/524 |
| 5,471,083 | 11/1995 | Ikeda et al. | 257/370 |
| 5,512,785 | 4/1996 | Haver et al. | 257/758 |
| 5,618,688 | 4/1997 | Reuss et al. | 438/199 |

FOREIGN PATENT DOCUMENTS

| | | |
|---|---|---|
| 60-195968 | 10/1985 | Japan . |
| 60-226162 | 11/1985 | Japan . |
| 61-73371 | 4/1986 | Japan . |
| 62-14456 | 1/1987 | Japan . |
| 64-72560 | 3/1989 | Japan . |
| 4-263435 | 9/1992 | Japan . |

OTHER PUBLICATIONS

High Performance 1.0 μmN–Well CMOS/Bipolar Technology, H. Momose, H. Shibata, Y. Mizutani, K. Kanzaki, and S. Kohyama, Symposium on VLSI Technology, Sep. 1983, pp. 40–41.

A 1.0 μmN–Well CMOS/Bipolar Technology for VSLI Circuits, J. Miyamoto, S. Saitoh, H. Momose, H. Shibata, K. Kanzaki and S. Kohyama, IEDM Digest of Technical Papers, Dec. 1983, pp. 63–66.

*Primary Examiner*—Wael Fahmy
*Assistant Examiner*—Howard Weiss
*Attorney, Agent, or Firm*—Lowe, Price, LeBlanc & Becker

[57] ABSTRACT

In a bipolar transistor of a type in which metal electrodes are formed in direct contact with a p-type external base region and an n-type collector region, respectively, an external base region surrounding an outer periphery of an n-type emitter region is formed. A metal electrode is formed on the emitter region with a polycrystalline silicon layer therebetween. Thereby, formation of a buried diffusion layer can be eliminated, and thus a manufacturing cost of the bipolar transistor can be reduced while achieving a high performance of the bipolar transistor.

9 Claims, 12 Drawing Sheets

SINGLE-POLY-TYPE BIPOLAR TRANSISTOR

BACKGROUND OF THE INVENTION

1. Field of the Invention

The present invention relates to a bipolar transistor, a semiconductor device having a bipolar transistor and a method of manufacturing the same, and in particular to a bipolar transistor of a type (which will be merely referred to as "single-poly-type bipolar transistor"), in which a metal electrode is in contact with a portion of a surface of an external base region and a portion of a surface of an emitter region, and the emitter region is electrically connected to the metal electrode via a polycrystalline silicon layer, as well as a semiconductor device having such a bipolar transistor and a method of manufacturing the same.

2. Description of the Background Art

Such a single-poly-type bipolar transistor has been well known. A conventional single-poly-type bipolar transistor will be described below with reference to FIGS. 22 and 23. FIG. 22 is a plan showing a conventional single-poly-type bipolar transistor. FIG. 23 is a cross section taken along line XXIII—XXIII in FIG. 22.

Referring first to FIG. 23, an n-well region 2 is formed at a main surface of a p-type silicon substrate 1. Isolating oxide films 3 are formed selectively at the main surface of the p-type silicon substrate 1. A p-type base region 4 is formed at the surface of n-well region 2. A p-type external base region 5 is formed adjacently to base region 4. An n-type emitter region 6 is formed at a surface of base region 4.

At a surface of n-well region 2, there is formed an n-collector lead region 7 spaced from base region 4. On a main surface of p-type silicon substrate 1, there is formed a first interlayer insulating layer 8 which has a contact hole 13 located above emitter region 6. A polycrystalline silicon layer 9 forming a portion of the emitter electrode is formed in contact hole 13.

Polycrystalline silicon layer 9 and first interlayer insulating layer 8 are covered with a second interlayer insulating layer 10. Second interlayer insulating layer 10 is provided with a contact hole 14a reaching a surface portion of collector region 7, a contact hole 14b reaching a partial surface of polycrystalline silicon layer 9 and a contact hole 14c reaching a partial surface of external base region 5. Metal electrodes 11a, 11b and 11c made of material containing aluminum are formed in contact holes 14a, 14b and 14c, respectively.

Referring to FIG. 22, collector region 7, emitter region 6 and external base region 5 are aligned laterally linearly in the conventional single-poly-type bipolar transistor.

However, the following problem arises in the conventional single-poly-type bipolar transistor described above. A collector resistance is in a range from hundreds to thousands of ohms in the single-poly-type bipolar transistor described above. Therefore, when the bipolar transistor is operated with a voltage close to a saturation voltage, an emitter crowding effect remarkably appears, so that a collector current can flow only to an end of the emitter near external base region 5. More specifically, the collector current concentrates at a region 12 in FIG. 22.

As a result, the collector current lowers, resulting in deterioration of device characteristics. The deterioration of device characteristics cannot be ignored particularly in the case where an n-type buried diffusion layer is eliminated for reducing a manufacturing cost. The reason for this is that the collector resistance increases to some extent due to elimination of a heavily doped n-type buried diffusion layer, and thus saturation is liable to occur.

SUMMARY OF THE INVENTION

The invention has been developed for overcoming the above mentioned problem, and it is an object of the invention to provide a semiconductor device having a high-performance bipolar transistor, in which a manufacturing cost is reduced owing to elimination of a heavily doped buried diffusion layer and a collector resistance is reduced, and a method of manufacturing the same.

A bipolar transistor according to the invention includes a semiconductor substrate of a first conductivity type having a main surface, an impurity diffusion layer of a second conductivity type, a base region of the first conductivity type, an emitter region of the second conductivity type, an external base region of the first conductivity type, a pad conductive layer, an interlayer insulating layer, and first, second and third metal electrodes. The impurity diffusion layer is formed at the main surface of the semiconductor substrate. The base region is formed at a surface of the impurity diffusion layer. The emitter region is formed at a surface of the base region. The external base region is connected to the base region, is formed at the surface of the impurity diffusion layer and surrounds the base region and the emitter region. The pad conducive layer is formed on the emitter region and is in contact with a surface of the emitter region. The interlayer insulating layer is formed on the main surface of the semiconductor substrate, and has first, second and third contact holes reaching a surface of the impurity diffusion layer, a surface of the external base region and a surface of the pad conductive layer, respectively. The first, second and third metal electrodes are formed in the first, second and third contact holes, respectively.

According to the bipolar transistor of the invention described above, the external base region surrounds the emitter region. Thereby, a current can flow along an entire periphery of the emitter region. Thus, it is possible to avoid local concentration of the current which may be caused by the emitter crowding effect. Consequently, the collector resistance can be reduced.

A semiconductor device having a bipolar transistor according to the invention includes a semiconductor substrate of a first conductivity type having a main surface, an MOS transistor, an impurity diffusion layer of a second conductivity type, a base region of the first conductivity type and an emitter region of the second conductivity type. The MOS transistor has a pair of source/drain regions of the second conductivity type formed at the main surface of the semiconductor substrate. The impurity diffusion layer is formed at the main surface of the semiconductor substrate and is spaced from the MOS transistor. The base region is formed at a surface of the impurity diffusion layer. The external base region is formed at the surface of the impurity diffusion layer and surrounds the base region. The emitter region is formed at a surface of the base region. The source/drain regions have a diffusion depth larger than a diffusion depth of the external base region.

According to the semiconductor device having the bipolar transistor of the invention described above, the diffusion depth of the source/drain regions is larger than the diffusion depth of the external base region. Therefore, in the process of manufacturing a structure in which a groove surrounded by and extending through the external base region is formed, and the base region and the emitter region are formed at a bottom surface of the groove, it is possible to form, at the same step, the groove and an opening for forming a contact between an electrode of the MOS transistor and one of the source/drain regions. Therefore, the manufacturing step can be simplified. Since the external base region surrounds the base region, the collector resistance is reduced also in this structure.

According to a method of manufacturing a bipolar transistor of one aspect of the invention, an impurity of a second conductivity type is selectively introduced into a main surface of a semiconductor substrate of a first conductivity type to form an impurity diffusion layer. An impurity of a first conductivity type is selectively introduced into a surface of the impurity diffusion layer to form an external base region. Etching is selectively effected on a surface of the external base region to form a groove surrounded by the external base region and extending in a depth direction of the semiconductor substrate through the external base region. The impurity of the first conductivity type is introduced into a bottom surface of the groove to form a base region. A side wall insulating layer is formed on a side wall of the groove. An emitter region of the second conductivity type having a side end located immediately under the side wall insulating layer is formed at the bottom surface of the groove. A pad conducive layer is formed on and in contact with the bottom surface of the groove. A first metal electrode in contact with a surface of the impurity diffusion layer, a second metal electrode in contact with a surface of the pad conducive layer and a third metal electrode in contact with a surface of the external base region are formed.

According to the method of manufacturing the semiconductor device having the bipolar transistor of the above aspect of the invention, the surface of the external base region is selectively etched to form the groove which is surrounded by the external base region and extends in the depth direction of the semiconductor substrate through the external base region. The base region and the emitter region are formed at the bottom surface of the groove. Thereby, the external base region can surround the base region and the emitter region. Consequently, the collector resistance can be reduced. This allows elimination of formation of a buried diffusion region, and thus a manufacturing cost can be reduced.

According to a method of manufacturing a bipolar transistor of another aspect of the invention, an impurity of a second conductivity type is selectively introduced into a main surface of a semiconductor substrate of a first conductivity type to form an impurity diffusion layer. Isolating oxide films are formed on an element isolating region and an emitter formation region in the main surface of the semiconductor substrate. An impurity of the first conductivity type is selectively introduced into the main surface of the semiconductor substrate around the emitter formation region to form an external base region surrounding the emitter formation region. By removing the isolating oxide film formed at the emitter formation region, a concavity surrounded by the external base region and extending in the depth direction of the semiconductor substrate through the external base region is formed at the main surface of the semiconductor substrate. The impurity of the first conductivity type is introduced into a bottom surface of the concavity to form a base region. An insulating layer having an opening located on the bottom surface of the concavity is formed on the main surface of the semiconductor substrate. An emitter region of the second conductivity type is formed at the bottom surface of the concavity located in the opening. A pad conducive layer is formed on and in contact with the bottom surface of the concavity located in the opening. A first metal electrode in contact with a surface of the impurity diffusion layer, a second metal electrode in contact with a surface of the pad conducive layer and a third metal electrode in contact with a surface of the external base region are formed.

According to the method of manufacturing the bipolar transistor of the above aspect of the invention, the isolating oxide film is formed on the emitter formation region, and the external base region surrounding the emitter formation region is formed at the main surface of the semiconductor substrate around the emitter formation region. The isolating oxide film formed at the emitter formation region is removed to form the concavity surrounded by the external base region and extending in the depth direction of the semiconductor substrate through the external base region. The base region and the emitter region are formed at the bottom surface of the concavity. Thereby, the external base region surrounding the base region and the emitter region can be formed. This allows reduction of the collector resistance similar to the method of the aforementioned one aspect. Also in this aspect, a manufacturing cost can be reduced similarly to the aforementioned one aspect. Since the emitter formation region is covered with the isolating oxide film before formation of the concavity, the emitter formation region can be formed together with another element such as an MOS transistor without causing damage to the emitter formation region which may be caused due to the process before formation of the concavity.

According to a method of manufacturing a bipolar transistor of still another aspect of the invention, an impurity of a second conductivity type is selectively introduced into a main surface of a semiconductor substrate of a first conductivity type. An impurity of a first conductivity type is selectively introduced into a surface of the impurity diffusion layer to form a base region. An insulating layer having an opening partially exposing a surface of the base region is formed on the main surface of the semiconductor substrate. An emitter region of the second conductivity type is formed at the main surface of the semiconductor substrate located immediately under the opening. A pad conducive layer is formed on the main surface of the semiconductor substrate located in the opening, and extends over the insulating layer covering the base region around the emitter region is formed. Using this pad conductive layer as a mask, the impurity of the first conductivity type is selectively implanted into the main surface of the semiconductor substrate around the pad conducive layer to form an external base region surrounding the base region. A first metal electrode in contact with a surface of the impurity diffusion layer, a second metal electrode in contact with a surface of the pad conducive layer and a third metal electrode in contact with a surface of the external base region are formed.

According to the method of manufacturing the bipolar transistor of the above aspect of the invention, the base region is formed, and then the pad conductive layer covering the base region is formed. The impurity of the first conductivity type is implanted into the main surface of the semiconductor substrate around the pad conducive layer to form the external base region, using the pad conductive layer as a mask. Thereby, the external base region surrounding the base region can be formed. Since the emitter region is formed at the surface of the base region, the external base region also surrounds the emitter region. Thereby, the collector resistance can be reduced similarly to the aforementioned one aspect. Also in this case, the manufacturing cost can be reduced similarly to the aforementioned one aspect.

According to a method of manufacturing a semiconductor device having a bipolar transistor of an aspect of the invention, an impurity of a second conductivity type is selectively introduced into a main surface of a semiconductor substrate of a first conductivity type to form a first impurity diffusion layer. A gate electrode of an MOS transistor is formed on the main surface of the semiconductor substrate spaced from the first impurity diffusion layer with an insulating layer therebetween. Second and third impurity diffusion layers having a first diffusion depth are formed at the main surface of the semiconductor substrate to form a channel region of the MOS transistor immediately under the gate electrode. An impurity of the first conductivity type is selectively introduced into a surface of the first impurity diffusion layer to form an external base region of a second diffusion depth smaller than the first diffusion depth. The main surface of the semiconductor substrate is selectively etched to form a first groove surrounded by the external base region and extending in the depth direction of the semiconductor substrate through the external base region and a second groove having a bottom surface located in the second impurity diffusion layer. The impurity of the first conductivity type is introduced into the bottom surface of the first groove to form a base region. Side wall insulating layers are formed at side walls of the first and second grooves. An emitter region of the second conductivity type having a side end located immediately under the side wall insulating layer is formed at the bottom surface of the first groove. First and second pad conducive layers in contact with the bottom surfaces of the first and second grooves are formed on the bottom surfaces of the first and second grooves. A first metal electrode in contact with a surface of the first impurity diffusion layer, second and third metal electrodes in contact with surfaces of the first and second pad conducive layers, and a fourth metal electrode in contact with a surface of the external base region are formed.

According to the method of manufacturing the semiconductor device having the bipolar transistor of the above aspect of the invention, the first groove extending through the external base region and the second groove for forming the electrode of the MOS transistor can be formed at the same step. Thereby, the manufacturing process can be simplified. Also in this aspect, the base region and the emitter region are formed at the bottom surface of the first groove. Thereby, the external base region surrounding the base region and the emitter region can be formed. This allows reduction of the collector resistance of the bipolar transistor. Also in this case, the manufacturing cost can be reduced similarly to the aforementioned one aspect.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to FIGS. 1 to 21.

(First Embodiment)

Figure 1:
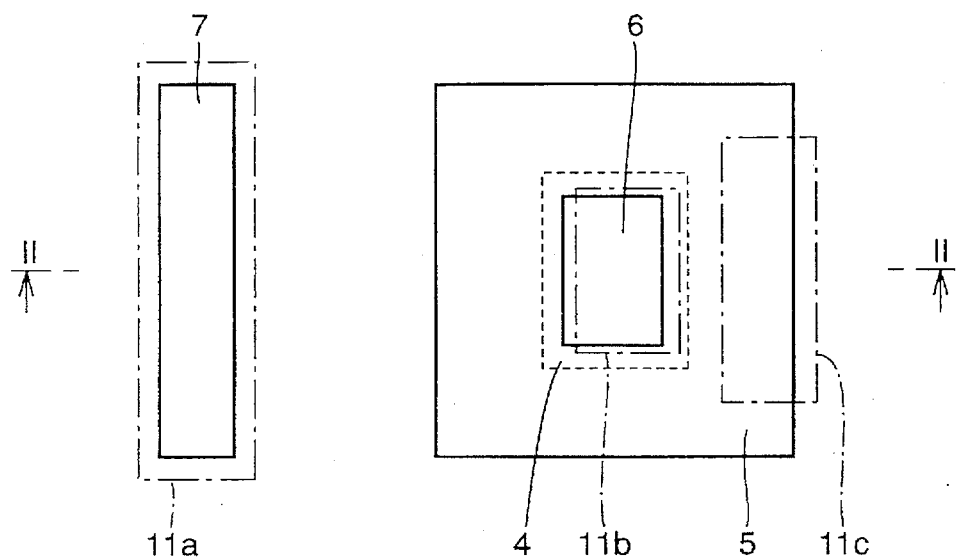
FIG. 1 is a plan showing a bipolar transistor of a first embodiment of the invention.

A first embodiment of the invention will be described below with reference to FIGS. 1 to 6. FIG. 1 is a plan showing a bipolar transistor of the first embodiment of the invention, and FIG. 2 is a cross section taken along line II—II in FIG. 1.

Figure 2:
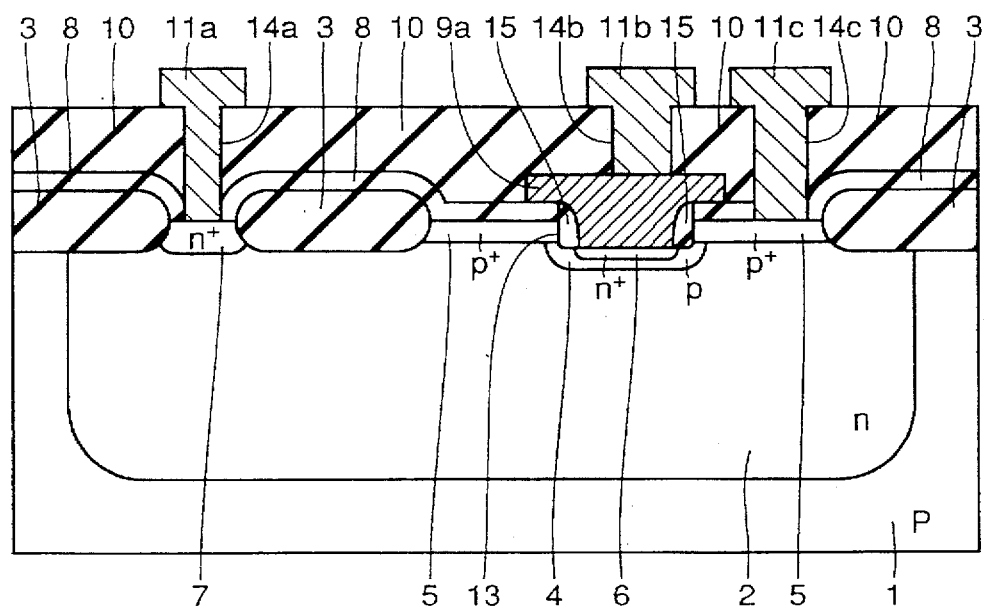
FIG. 2 is a cross section taken along line II—II in FIG. 1.

Referring to FIGS. 1 and 2, a structure of the bipolar transistor of this embodiment will be described below. Referring to FIG. 2, an n-well 2 is formed at a main surface of a p-type silicon substrate 1. An external base region 5 of the p-type is formed at a surface of n-type well region 2. External base region 5 contains p-type impurity at a high concentration.

On the main surface of p-type silicon substrate 1, there is formed a groove (contact hole 13) which extends through external base region 5 in the depth direction of the p-type silicon substrate 1. A base region 4 of the p-type is formed immediately under contact hole 13. An emitter region 6 of the n-type is formed at the surface of base region 4.

A side wall insulating layer 15 made of an insulator such as a silicon oxide film or a silicon nitride film is formed at a side wall of contact hole 13. A side end of emitter region 6 is located immediately under side wall insulating layer 15, and a side end of base region 4 is located under the external base region 5.

A collector lead region 7 spaced from external base region 5 is formed at the surface of n-well region 2. The concentration of n-type impurity contained in n-well region (collector region) 2 immediately under base region 4 is, for example, $5 \times 10^8 cm^{-3}$. In this case, a buried diffusion layer containing n-type impurity at a high concentration is not formed in the bipolar transistor as shown in FIG. 2. Thereby, the manufacturing cost can be reduced.

Isolating oxide films 3 are formed selectively at the main surface of p-type silicon substrate 1. A first interlayer insulating layer 8 made of, e.g., a silicon oxide film is formed on the main surface of p-type silicon substrate 1. Contact hole 13 extends also through first interlayer insulating layer 8. There is provided a polycrystalline silicon layer (pad conducive layer) 9a formed in contact hole 13 and extending over a surface of first interlayer insulating layer 8.

A second interlayer insulating layer 10 made of, e.g., a silicon oxide film is formed over polycrystalline silicon layer 9a and first interlayer insulating layer 8. At second interlayer insulating layer 10, there are formed a contact hole 14a reaching a surface of collector lead region 7, a contact hole 14b reaching a surface of polycrystalline silicon layer 9a and a contact hole 14c reaching a surface of external base region 5. Metal electrodes 11a, 11b and 11c containing aluminum are formed in contact holes 14a, 14b and 14c, respectively.

The bipolar transistor thus constructed is provided with external base region 5 surrounding emitter region 6 as shown in FIG. 1. Thereby, a current can flow along an entire periphery of emitter region 6. Thereby, the collector current can be increased. Consequently, the collector resistance can be reduced, and the performance of bipolar transistor can be improved.

Referring to FIGS. 3 to 6, a method of manufacturing the bipolar transistor shown in FIGS. 1 and 2 will be described below. FIGS. 3 to 6 are cross sections showing 1st to 4th steps in a process of manufacturing the bipolar transistor of the above embodiment.

Figure 3:
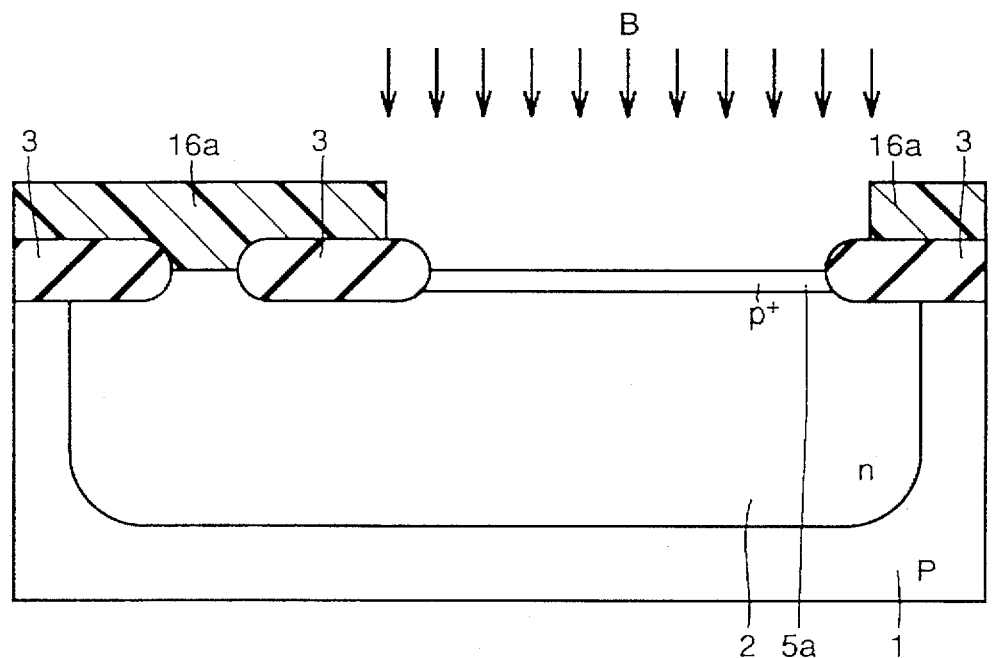
FIGS. 3 to 6 are cross sections showing 1st to 4th steps in a process of manufacturing the bipolar transistor of the first embodiment of the invention.

Referring first to FIG. 3, an LOCOS (Local Oxidation of Silicon) method or the like is performed to form isolating oxide films 3 selectively at the main surface of the p-type silicon substrate 1. A thermal diffusion method or an ion implantation method is performed to introduce n-type impurity selectively into the main surface of the p-type silicon substrate 1 to form n-well region 2. A concentration of an n-type impurity included in n-well region 2 is, e.g., $5 \times 10^{18}$ $cm^{-3}$. A resist pattern 16a exposing regions for forming the base region, emitter region and external base region is formed on the main surface of the p-type silicon substrate 1. Using this resist pattern 16a as a mask, p-type impurity such as boron (B) or $BF_2$ is implanted into the main surface of p-type silicon substrate 1. Thereby, a p-type impurity diffusion region 5a, a part of which forms external base region 5, is formed.

Figure 4:
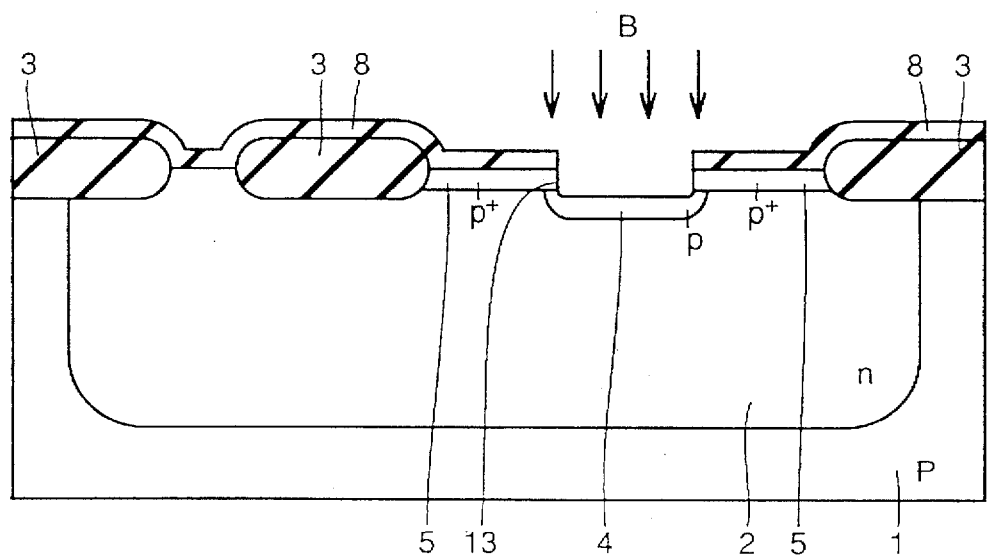
Figure 5:
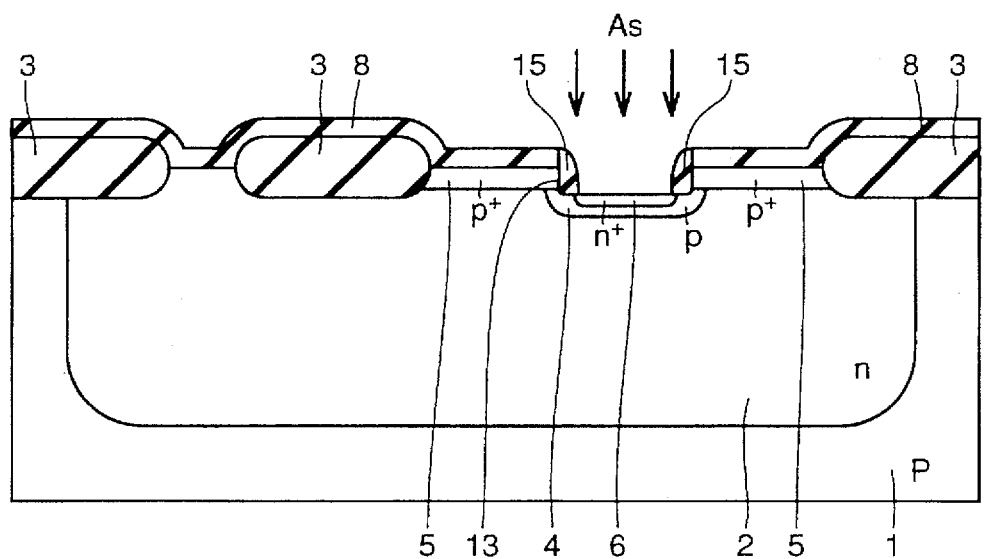

Referring to FIG. 4, a CVD (Chemical Vapor Deposition) method or the like is performed to form first interlayer insulating layer 8 made of, e.g., a silicon oxide film on the whole main surface of p-type silicon substrate 1. Then, contact hole 13 extending through first interlayer insulating layer 8 and p-type impurity diffusion layer 5 is formed. Thereby, external base region 5 of an annular shape is formed. Using first interlayer insulating layer 8 as a mask, p-type impurity such as boron (B) or $BF_2$ is implanted into the surface of n-well region 2. Thereby, true base region 4 is formed at the surface of n-well region 2 under contact hole 13. An insulating layer made of, e.g., a silicon oxide film or a silicon nitride film is deposited on the whole main surface of p-type silicon substrate 1, e.g., by the CVD method. Anisotropic etching is effected on this insulating layer. Thereby, side wall insulating layer 15 is formed at the side wall of contact hole 13. Using side wall insulating layer 5 and first interlayer insulating layer 8 as a mask, n-type impurity such as arsenic (As) or phosphorus (P) is implanted into the surface of n-well region 2. Thereby, n-type emitter region 6 is formed. Since side wall insulating layer 15 is used as a mask at this step, the side end of emitter region 6 is located immediately under side wall insulating layer 15. Side wall insulating layer 15 thus formed ensures a sufficient emitter-base breakdown voltage. The surface of emitter region 6 formed through the above steps is located at a level lower than the surface of external base region 5.

Figure 6:
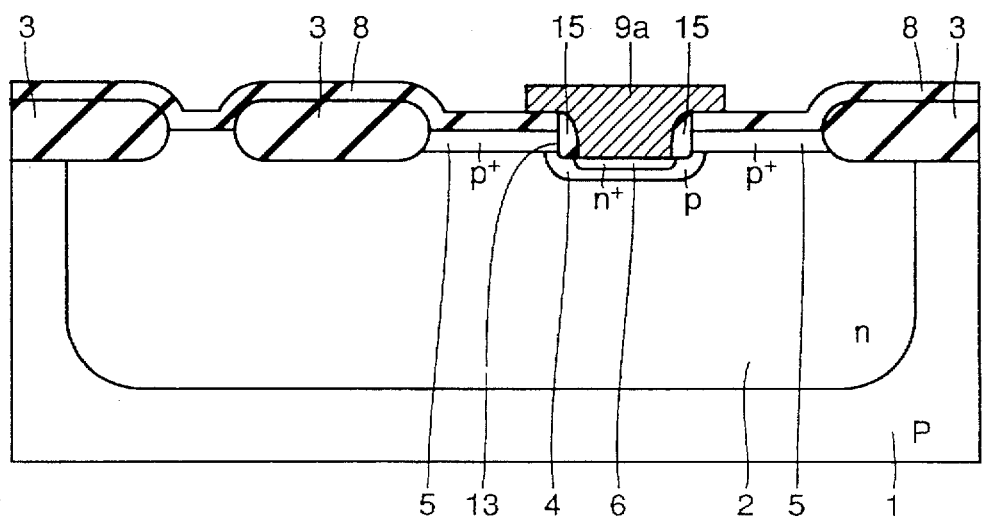

Referring to FIG. 6, the CVD method and etching method are performed to form polycrystalline silicon layer 9a in contact hole 13. Polycrystalline silicon layer 9a may be formed before formation of emitter region 6. In this case, polycrystalline silicon layer 9a is doped with n-type impurity, and then the n-type impurity is diffused from polycrystalline silicon layer 9 to form emitter region 6.

Thereafter, the CVD method or the like is performed to form second interlayer insulating layer 10 made of a silicon oxide film and covering first interlayer insulating layer 8 and polycrystalline silicon layer 9a. Contact holes 14a, 14b and 14c are formed at second interlayer insulating layer 10 by the etching technique. Then, a sputtering method or the like is performed to deposit a metal layer containing aluminum in contact holes 14a, 14b and 14c and on second interlayer insulating layer 10, and subsequently the metal layer is patterned. Thereby, metal electrodes 11a, 11b and 11c are formed. Through the above steps, the bipolar transistor shown in FIG. 2 is formed.

Figure 7:
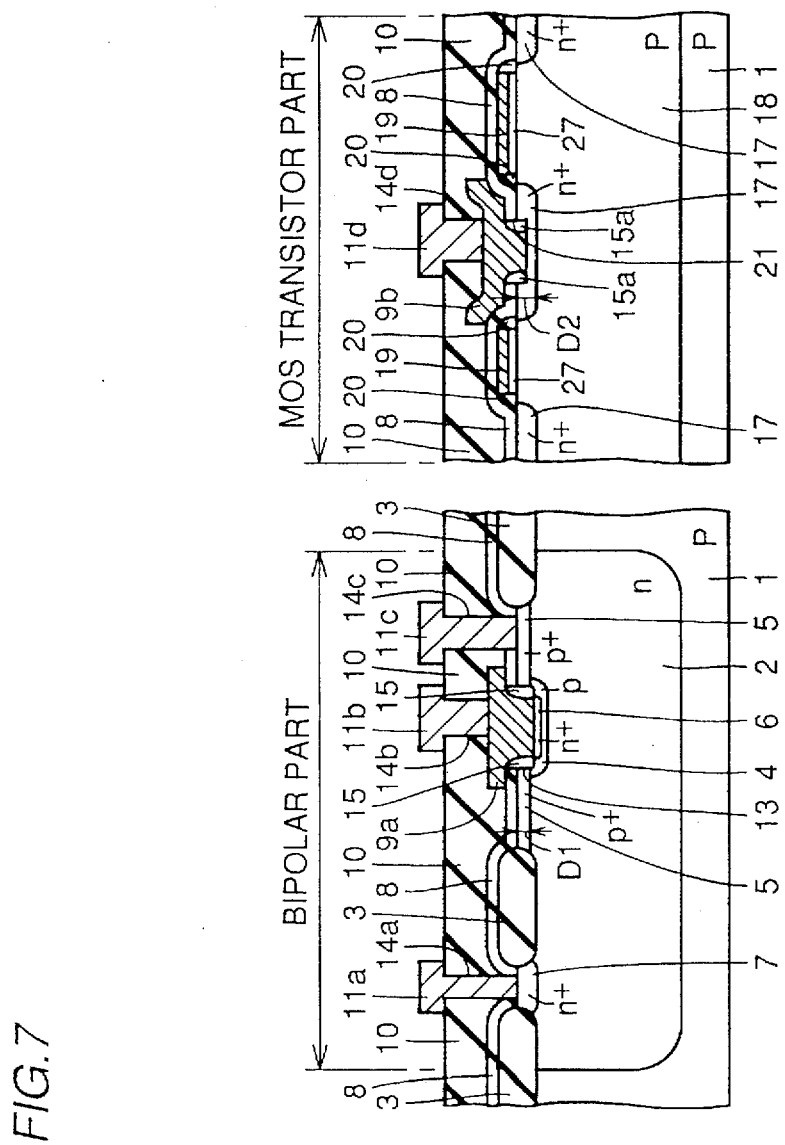
FIG. 7 is a cross section showing a semiconductor device having the bipolar transistor of the first embodiment of the invention.
Figure 8:
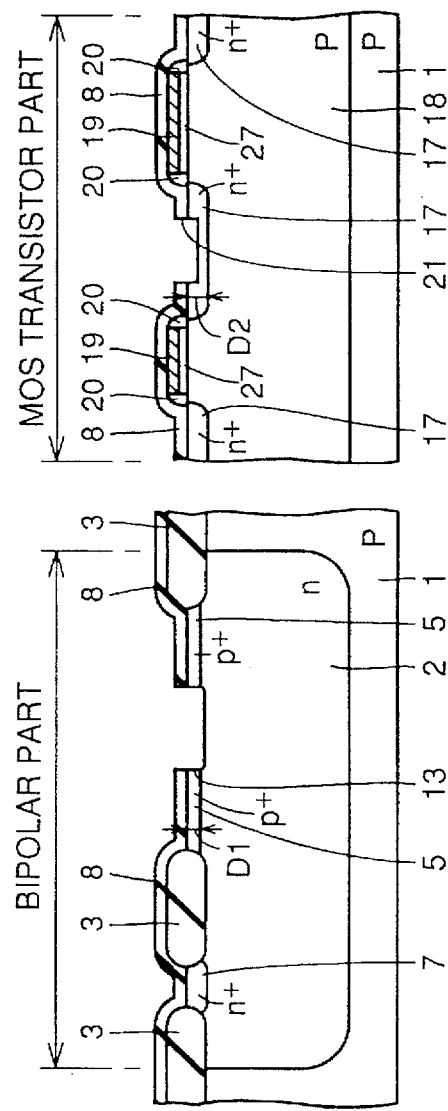
FIG. 8 is a cross section showing a distinctive step of manufacturing the semiconductor device shown in FIG. 7.

Referring to FIGS. 7 and 8, an example to which the bipolar transistor of the above embodiment is applied will be described below. FIG. 7 is a fragmentary cross section showing the semiconductor device including the bipolar transistor of the first embodiment. FIG. 8 is a cross section showing a distinctive step of manufacturing the semiconductor device in FIG. 7.

Referring to FIG. 7, the semiconductor device of this application example includes a bipolar part and an MOS transistor part. An nMOS transistor is formed in the MOS transistor part in this example. The MOS transistor is formed at a surface of a p-well region 18, and has n-type source/drain regions 17, a gate insulating layer 27 and a gate electrode 19. A contact hole 21 is formed above a surface of one of source/drain regions 17 and a bottom of contact hole 21 is located in this source or drain region 17.

A polycrystalline silicon layer 9b is formed in contact hole 21. Second interlayer insulating layer 10 is formed over polycrystalline silicon layer 9b. A contact hole 14d is formed at a portion of second interlayer insulating layer 10 located above polycrystalline silicon layer 9b. A metal electrode 11d is formed in contact hole 14d.

In the semiconductor device having the above structure, a diffusion depth D2 of source/drain regions 17 of the MOS transistor is set to a value larger than diffusion depth D1 of external base region 5 in the bipolar transistor. Thereby, it is possible to prevent effectively contact hole 21 from penetrating source/drain regions 17 even when contact holes 13 and 21 are formed at the same step. Thereby, contact holes 13 and 21 can be formed at the same step. Consequently, the process of manufacturing the semiconductor device can be simplified.

Contact hole 13 in the bipolar transistor may be formed at the same step as a contact hole other than contact hole 21 shown in FIG. 7.

Referring to FIG. 8, a method of manufacturing the semiconductor device will be described below. As shown in FIG. 8, n-well region 2 and p-well region 18 are formed at the main surface of p-type silicon substrate 1. The LOCOS method or the like is performed to form isolating oxide films 3. The thermal oxidation method or the like is performed to form gate insulating layer 27, and gate electrode 19 is formed on gate insulating layer 27.

Using gate electrode 19 as a mask, n-type impurity is introduced into the surface of p-well region 18 to form source/drain regions 17 of diffusion depth of D2. Then, the CVD method or the like is used to form first interlayer insulating layer 8 on the whole main surface of p-type silicon substrate 1.

A resist patter (not shown) having openings located at the base formation region of bipolar transistor and at the region for forming the electrode of MOS transistor. Using this resist pattern as a mask, first interlayer insulating layer 8 and the main surface of p-type silicon substrate 1 are etched. Thereby, contact holes 13 and 21 are simultaneously formed. This simplifies the manufacturing process.

Base region 4 and side wall insulating layer 15 are formed at the surface of n-well region 2 and in contact hole 13 in the same manner as already described. Side wall insulating layer 15a is formed on the side wall of contact hole 21 at the same step as the side wall insulating layer 15. Polycrystalline silicon layers 9a and 9b are formed in contact holes 13 and 21, respectively.

The CVD method or the like is used to form second interlayer insulating layer 10, and contact holes 14a, 14b and 14c are formed at second interlayer insulating layer 10. Metal electrodes 11a, 11b, 11c and lid are formed in contact holes 14a, 14b, 14c and 14d, respectively. Through the above steps, the semiconductor device shown in FIG. 7 is completed.

(Second Embodiment)

Figure 9:
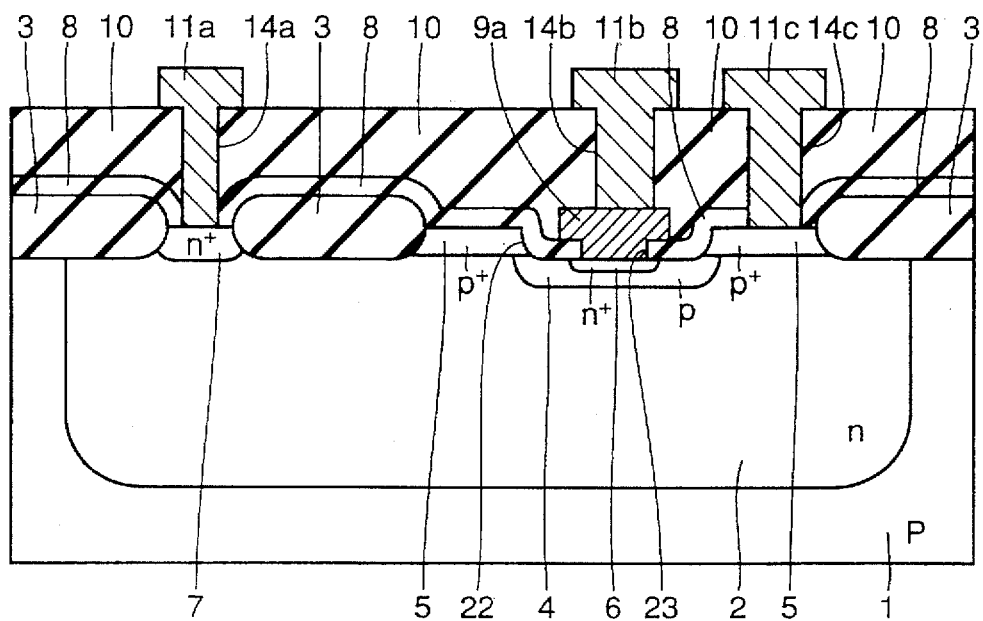
FIG. 9 is a cross section showing a bipolar transistor of a second embodiment of the invention.

Referring to FIGS. 9 to 12, a second embodiment of the invention will be described below. FIG. 9 is a cross section showing a bipolar transistor of the second embodiment of the invention.

Referring to FIG. 9, the bipolar transistor of this embodiment is provided with a concavity 22 which extends through external base region 5 and has a substantially half-elliptical section. More specifically, concavity 22 has the substantially same shape as the bottom shape of isolating oxide film formed by the LOCOS method. Base region 4 is formed immediately under the bottom of concavity 4, and emitter region 6 is formed at the surface of base region 4.

First interlayer hole 23 located on 8 having contact hole 23 located on the bottom surface of concavity 22 is formed. Polycrystalline silicon layer 9a is formed in contact hole 23. The side ends of emitter region 6 are located under the ends of first interlayer insulating layer 8 defining contact hole 23. Therefore, the breakdown voltage between the emitter and base can be improved by appropriately adjusting an open width of contact hole 23. Structures other than the above are the substantially same as that of the bipolar transistor of the first embodiment.

Figure 10:
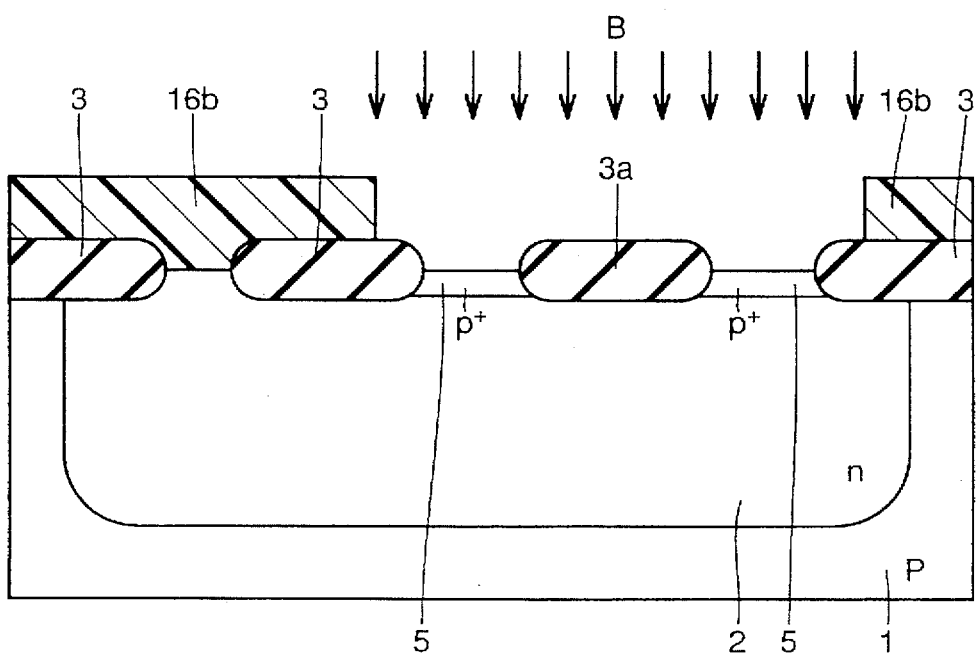
FIGS. 10 to 12 are cross sections showing 1st to 3rd steps in a process of manufacturing the bipolar transistor shown in FIG. 9.
Figure 11:
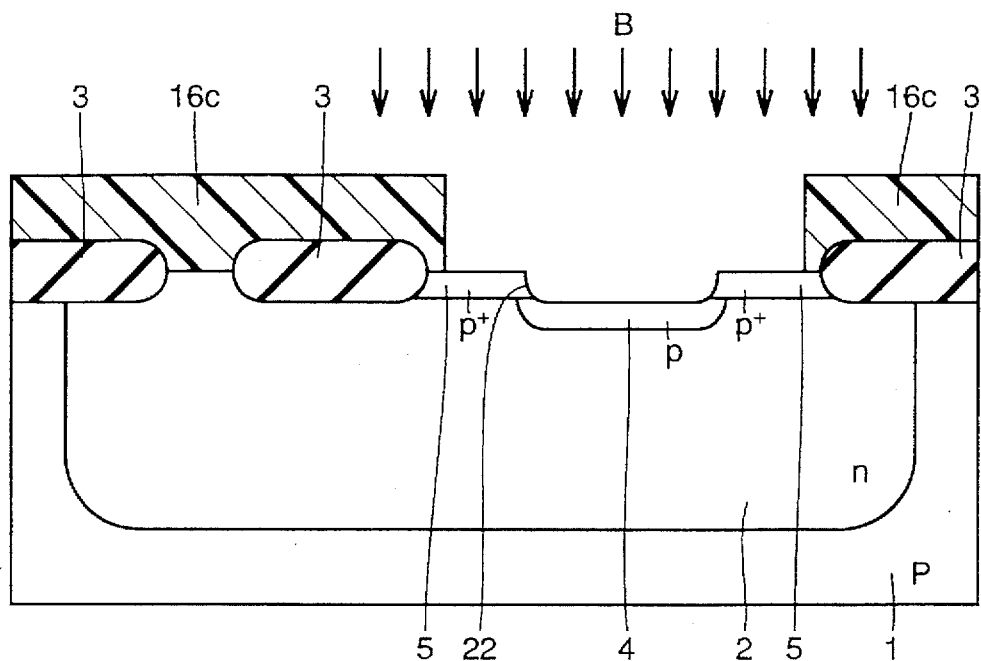
Figure 12:
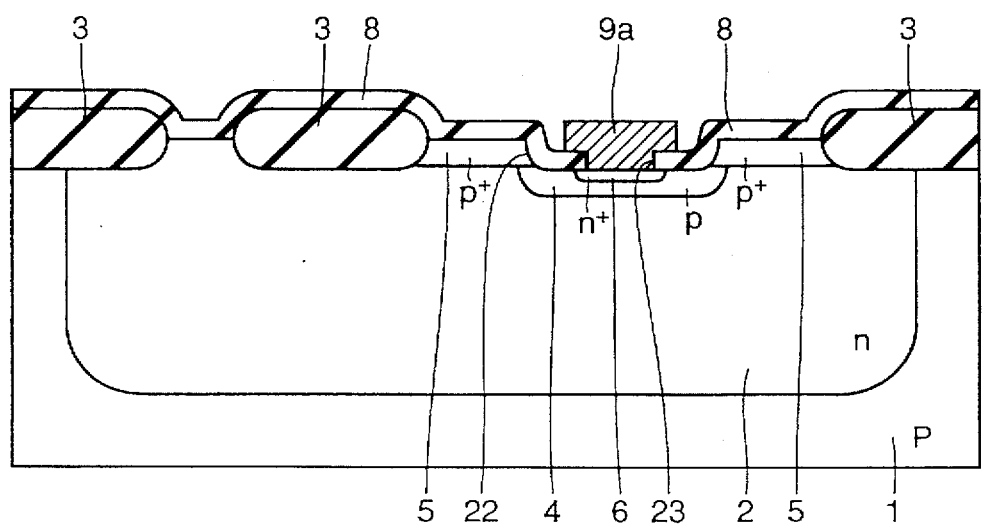

Referring to FIGS. 10 to 12, a method of manufacturing the bipolar transistor shown in FIG. 9 will be described below. FIGS. 10 to 12 are cross sections showing 1st to 3rd steps in a process of manufacturing the bipolar transistor shown in FIG. 9.

Referring first to FIG. 10, isolating oxide films 3 and n-well region 2 are formed by the same method as the first embodiment. In this embodiment, however, an isolating oxide films 3a is formed covering the emitter formation region at the same step of forming isolating oxide film 3. A resist pattern 16b exposing the region for forming the external base region is formed. Using this resist pattern 16b and isolating oxide film 3a as a mask, p-type impurity such as boron (B) or $BF_2$ is implanted into the surface of n-well region 2. Thereby, external base region 5 is formed.

Referring to FIG. 11, after removing resist pattern 16b, a resist pattern 16c which exposes external base region 5 and isolating oxide film 3a and covers isolating oxide films 3 is formed. Using this resist pattern 16c as a mask, wet etching is performed to remove isolating oxide film 3a. Thereby, concavity 22 is formed. Since a surface of concavity 22 was covered with isolating oxide film 3a before this step, the surface of concavity 22 was not damaged before this step.

Using resist pattern 16c as a mask, p-type impurity such as boron (B) or $BF_2$ is implanted into the bottom surface of concavity 22. Thereby, base region 4 is formed. Resist pattern 16c may be used for formation of external base region 5. In this case, the step of forming resist pattern 16b can be eliminated, so that the manufacturing process can be simplified.

Referring to FIG. 12, first interlayer insulating layer 8 is formed similarly to the first embodiment. Photolithography and etching technique are used to form contact hole 23 above the bottom surface of concavity 22. Emitter region 6 and polycrystalline silicon layer 9a are formed similarly to the first embodiment. At this step, the open width of contact hole 23 is appropriately adjusted, so that a large distance can be ensured between the side end of emitter region 6 and external base region 5. Thereby, the emitter-base breakdown voltage can be improved. The steps after the above step are performed similarly to the first embodiment, whereby the bipolar transistor shown in FIG. 9 is completed.

(Third Embodiment)

Referring to FIGS. 13 to 17, a third embodiment of the invention will be described below.

Figure 13:
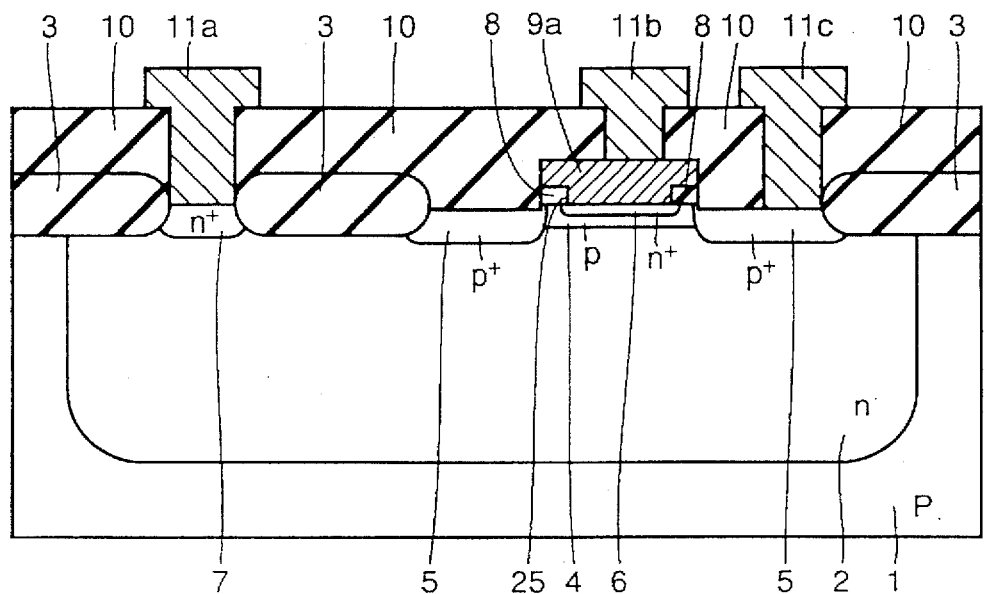
FIG. 13 is a cross section showing a bipolar transistor of a third embodiment of the invention.

FIG. 13 is a cross section showing the bipolar transistor of the third embodiment of the invention. Referring to FIG. 13, in the bipolar transistor of this embodiment first interlayer insulating layer 8 remains only under the side end of polycrystalline silicon layer 9a. The side end of emitter region 6 is located immediately under first interlayer insulating layer 8. One of the side ends of external base region 5 is spaced from the side end of emitter region 6 and is located immediately under first interlayer insulating layer 8. Other structures are similar to those of the first embodiment.

Referring to FIGS. 14 to 17, a method of manufacturing the bipolar transistor shown in FIG. 13 will be described below. FIGS. 14 to 17 show 1st to 4th steps in a process of manufacturing the bipolar transistor of this embodiment, respectively.

Figure 14:
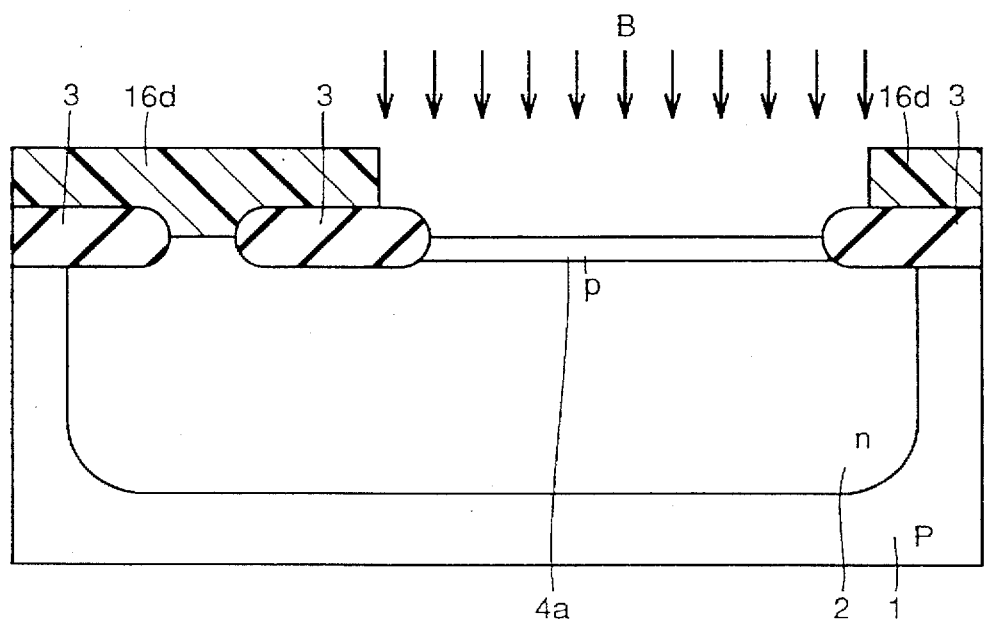
FIGS. 14 to 17 are cross sections showing 1st to 4th steps in a process of manufacturing the bipolar transistor shown in FIG. 13.
Figure 15:
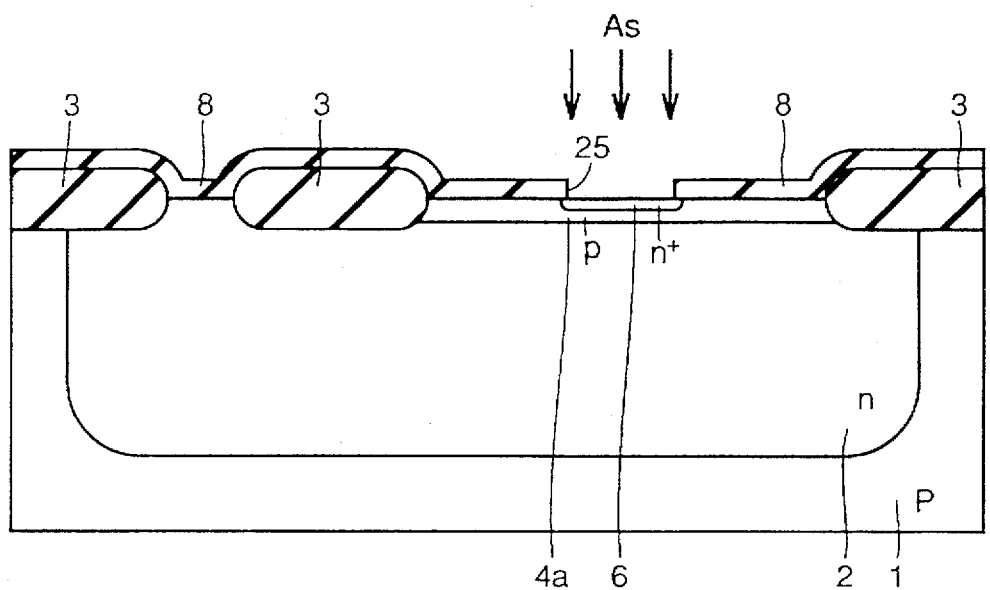

As shown in FIG. 14, n-well region 2 and isolating oxide film 3 are formed through the steps similar to those in the first embodiment. Resist patter 16d exposing the regions for forming base region 4 and external base region 5 is formed. Using this resist pattern 16d as a mask, p-type impurity such as boron (B) or $BF_2$ is implanted into the surface of n-well region 2. Thereby, p-type impurity diffusion region 4a, a part of which will form base region 4, is formed.

First interlayer insulating layer 8 is formed by a method similar to that in the first embodiment, and a contact hole 25 is formed at first interlayer insulating layer 8 located on the emitter formation region. Since a surface of p-type impurity diffusion region 4a under interlayer insulating layer 8 in the region for forming contact hole 25 is substantially flat in this step, contact hole 25 can be formed more easily that in the second embodiment. An impurity of the n-type such as arsenic (As) or phosphorus (P) is implanted into the surface of p-type impurity diffusion layer 4a through contact hole 25. Thereby, emitter region 6 is formed.

Figure 16:
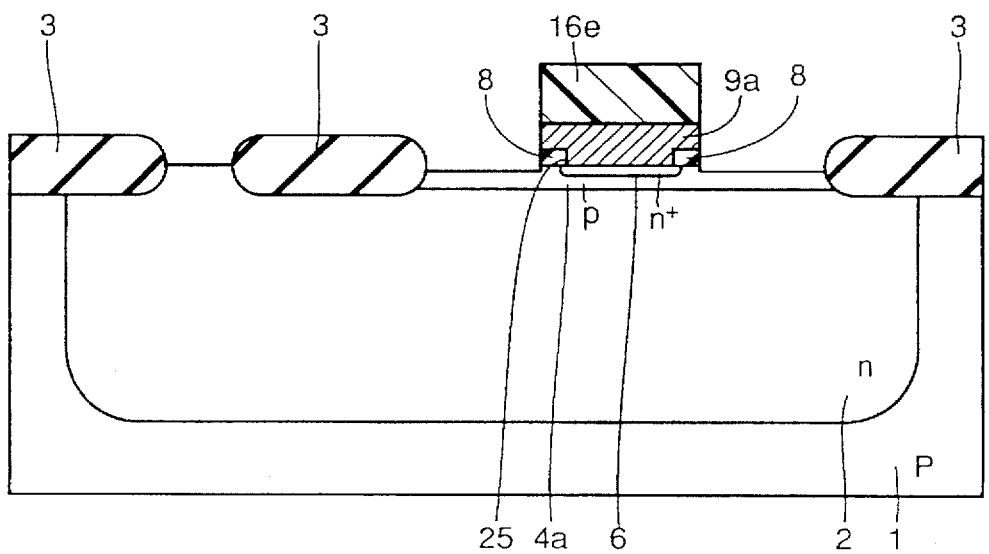

Referring to FIG. 16, a polycrystalline silicon layer is deposited on first interlayer insulating layer 8 by the CVD method. A resist pattern 16e which is patterned into a predetermined configuration is formed on the polycrystalline silicon layer. Using resist pattern 16e as a mask, the polycrystalline silicon layer is patterned. Thereby, polycrystalline silicon layer 9a is formed. Using resist pattern 16e as a mask, etching is effected further on first interlayer insulating layer 8. Thereby, the surface of p-type impurity diffusion layer 4a is partially exposed. As a result, p-type impurity diffusion layer 4a has the exposed surface located lower than the surface of emitter region 6. Emitter region 6 may be formed by diffusing impurity after forming polycrystalline silicon layer 9a similarly to the first embodiment.

Figure 17:
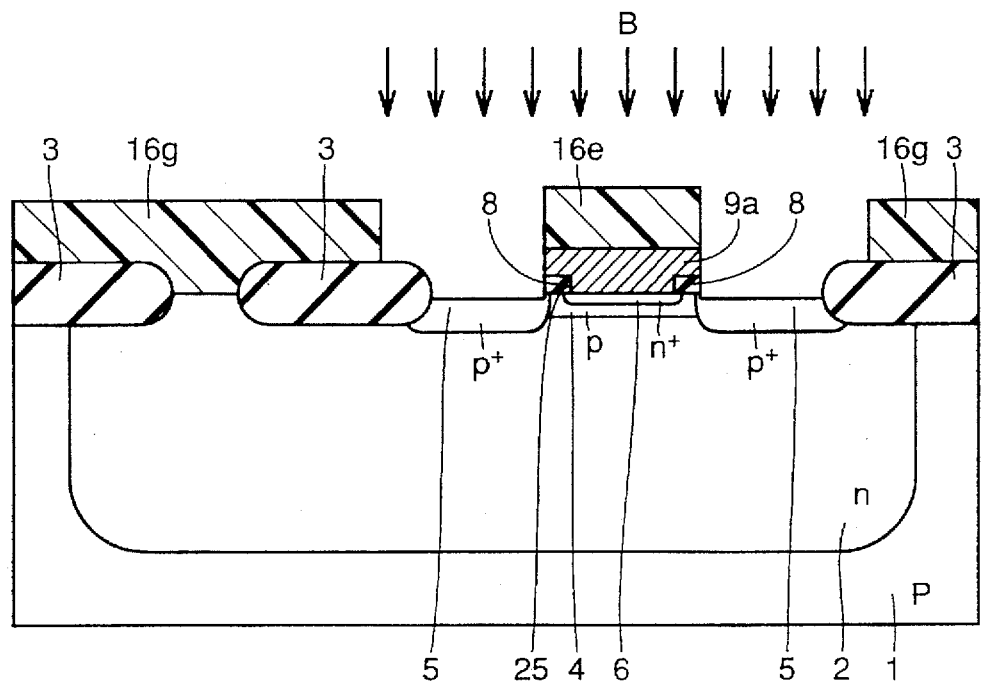

Referring to FIG. 17, a resist pattern 16g having an opening located on the surface of external base region 5. Using resist pattern 16g and 16e as a mask, p-type impurity such as boron (B) or $BF_2$ is implanted into the surface of p-type impurity diffusion layer 4a. Thereby, external base region 5 is formed. Thereafter, steps similar to those in the first embodiment are performed to complete the bipolar transistor shown in FIG. 13.

Figure 18:
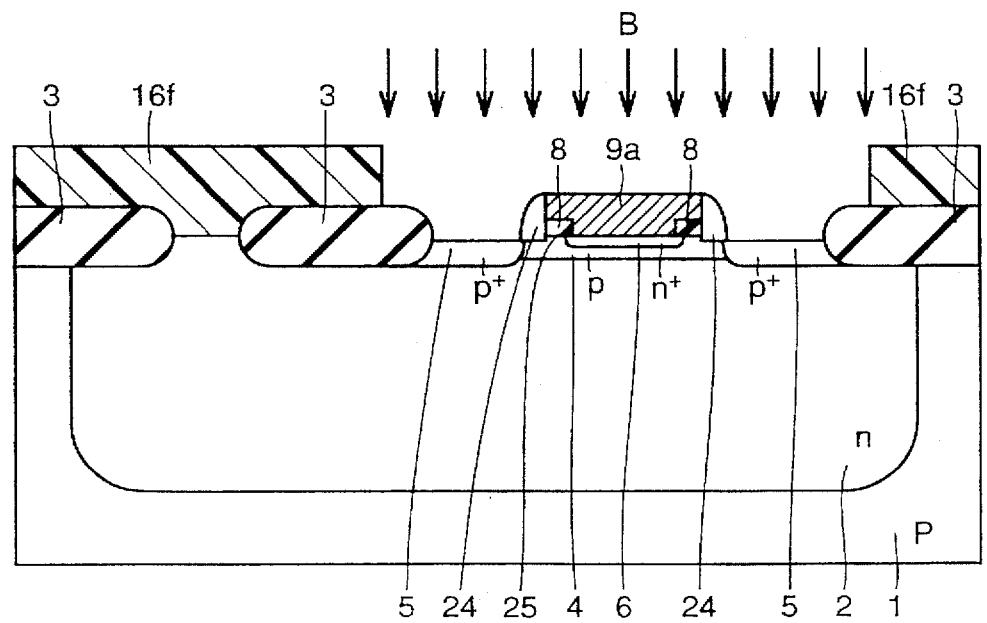
FIG. 18 is a cross section showing a distinctive manufacturing step in a modification of the third embodiment.
Figure 19:
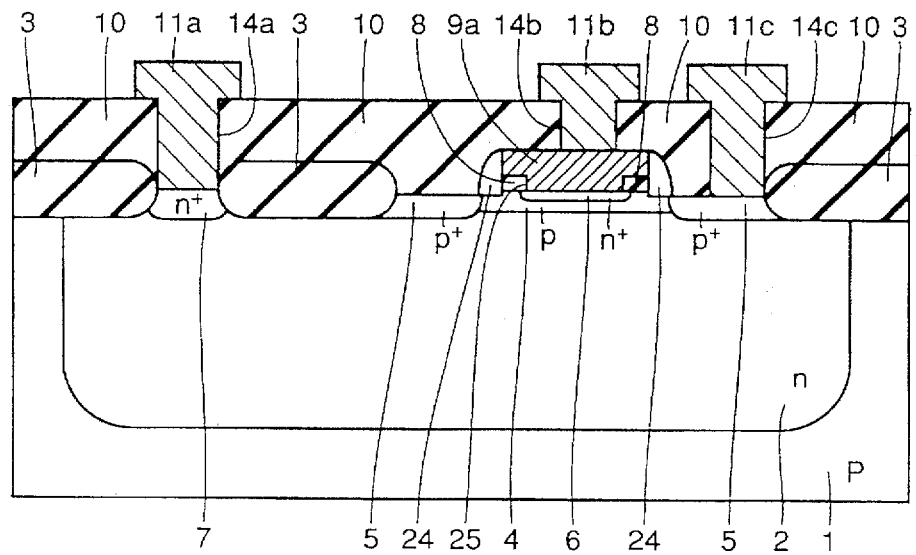
FIG. 19 is a cross section showing a bipolar transistor of a modification of a third embodiment of the invention.

Referring to FIGS. 18 and 19, a modification of the third embodiment will be described below. In the above third embodiment, it is necessary to protrude the side end of polycrystalline silicon layer 9a in the direction parallel to the main surface of p-type silicon substrate 1 in order to improve the emitter-base breakdown voltage. This may cause a possibility of unpreferable increase of a parasitic capacitance between polycrystalline silicon layer 9a and p-type silicon substrate 1. This modification has been devised to avoid completely such possibility.

FIG. 18 is a cross section showing a distinctive step in this modification. FIG. 19 is a cross section showing a bipolar transistor of this modification.

Referring first to FIG. 18, until the step of forming polycrystalline silicon layer 9a, the same steps are performed similarly to the third embodiment, and then resist pattern 16e is removed. Side wall insulating layer 24 is formed on the side wall of polycrystalline silicon layer 9a by the same method as that in the first embodiment. Thereafter, a resist pattern 16f exposing the region for forming the external base region is formed. Using resist pattern 16f as a mask, p-type impurity such as boron (B) or $BF_2$ is implanted into the surface of p-type impurity diffusion layer 4a. Thereby, external base region 5 is formed. Thereafter, steps similar to those in the first embodiment are performed to complete the bipolar transistor shown in FIG. 19.

Owing to formation of side wall insulating layer 24 as shown in FIGS. 18 and 19, a large distance can be ensured between emitter region 6 and external base region 5. Thereby, the emitter-base breakdown voltage can be improved without increasing the parasitic capacitance between polycrystalline silicon layer 9a and p-type silicon substrate 1.

(Fourth Embodiment)

Figure 20:
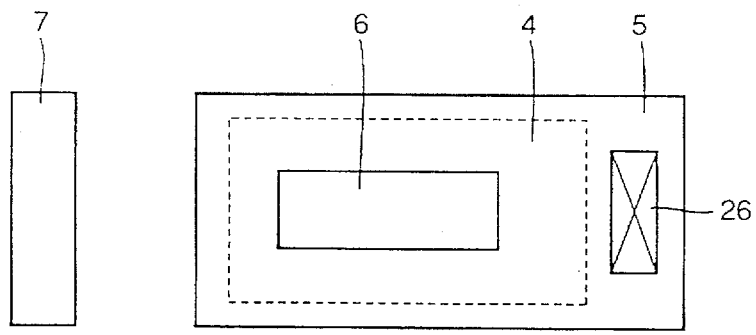
FIG. 20 shows a bipolar transistor of a fourth embodiment of the invention.
Figure 21:
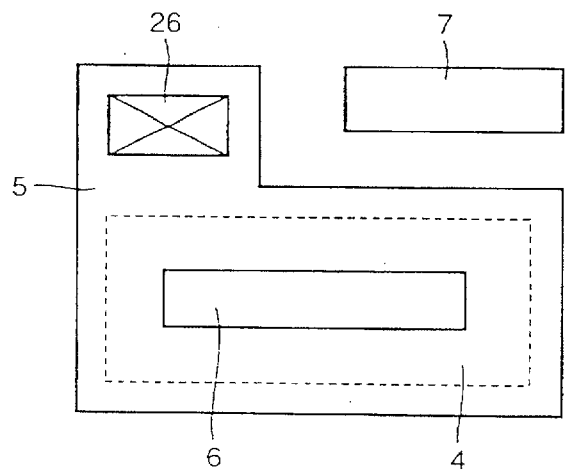
FIG. 21 is a plan showing a modification of the bipolar transistor shown in FIG. 20.
Figure 22:
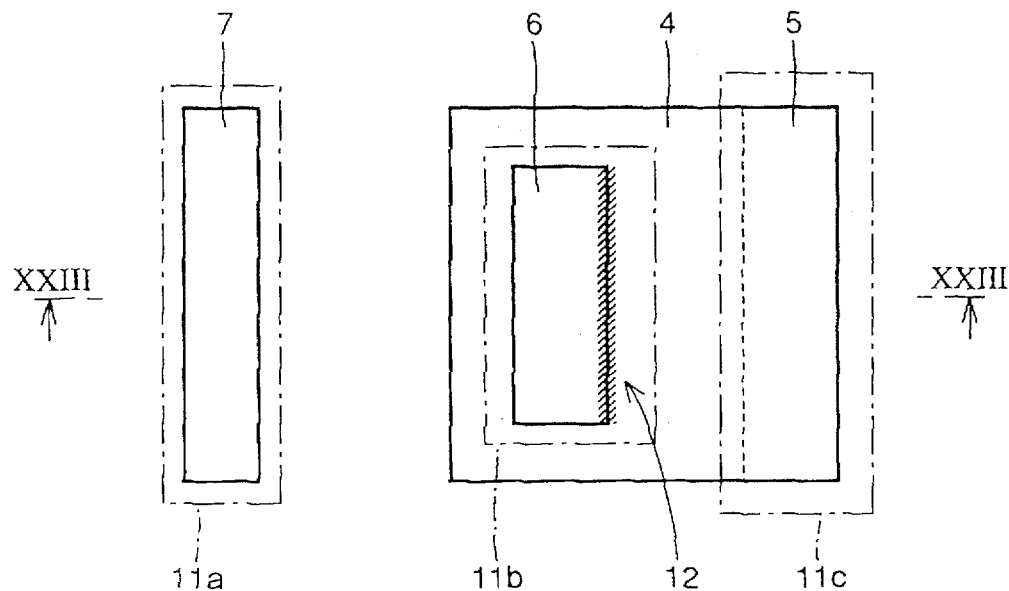
FIG. 22 is a plan showing a bipolar transistor in the prior art.
Figure 23:
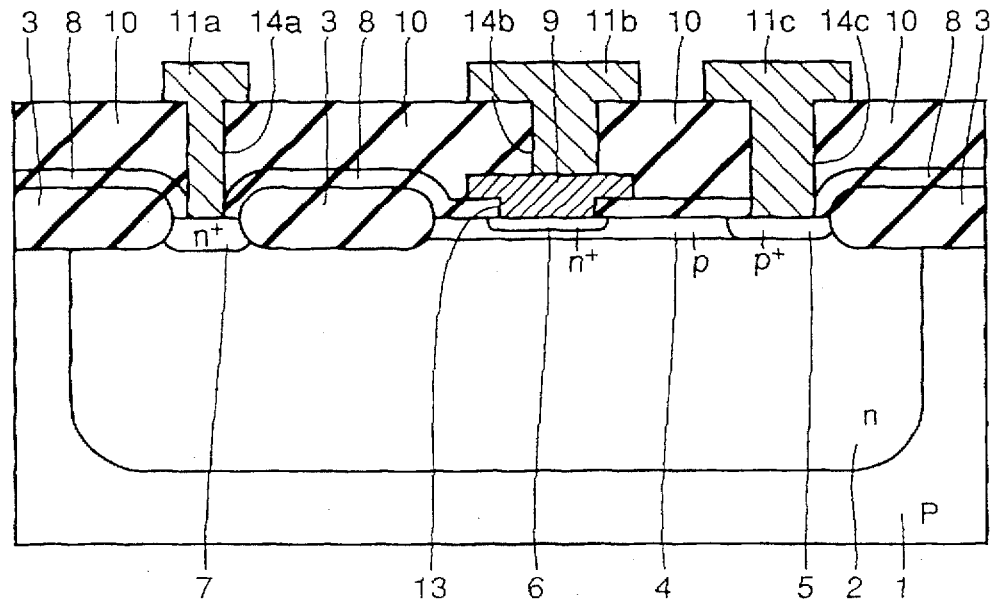
FIG. 23 is a cross section taken along line XXIII—XXIII in FIG. 22.

A fourth embodiment of the invention will be described below with reference to FIGS. 20 and 21. FIG. 20 is a plan of a bipolar transistor of the fourth embodiment of the invention. FIG. 21 is a plan showing a bipolar transistor which is a modification of the bipolar transistor shown in FIG. 20.

Referring to FIG. 20, emitter region 6 has a rectangular planar shape. Collector region 7 is formed at a position opposed to one of short sides of emitter region 6. A contact 26 between the base electrode and the external base region is formed at a position opposed to the other short side of emitter region 6. Owing to this arrangement of collector region 7 and contact 26 in this fashion, a planar area of the bipolar transistor can be reduced.

Referring to FIG. 21, contact 26 and collector region 7 neighbor to each other, and emitter region 6 is opposed to both contact 26 and collector region 7. Thereby, a distance between emitter region 6 and collector region 7 can be shorter than that in the structure shown in FIG. 20. Thereby, it is possible to prevent effectively the rise of collector resistance. The arrangement that contact 26 and collector region 7 neighboring to each other are located at the same side with respect to emitter region 6 can also reduce the planar area of the bipolar transistor.

Although each of the above embodiments has been described in connection with the npn bipolar transistors, the invention can be applied to pnp bipolar transistors. Polycrystalline silicon layer 9a may be polycide. In each of the above embodiments, $n^+$ buried layer may be formed.

According to the invention, as described hereinabove, the single-poly-type bipolar transistor is provided with the external base region surrounding the emitter region. Thereby, it is possible to prevent local concentration of a current caused by the emitter crowding effect. Therefore, it is possible to reduce the collector resistance. As a result, the invention can provide the single-poly-type bipolar transistor of a high performance. The invention is particularly effectively applied to the single-poly-type bipolar transistor in which a heavily doped buried diffusion layer is not formed. Thus, the invention can be particularly effectively applied to the bipolar transistor of which collector resistance is relatively large.

As described above, the present invention can provide the single-poly-type bipolar transistor of an improved performance, of which manufacturing cost is reduced owing to elimination of formation of the buried diffusion layer, as well as the semiconductor device having such a single-poly-type bipolar transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bipolar transistor comprising:

a semiconductor substrate of a first conductivity type having a main surface;

an impurity diffusion layer of a second conductivity type formed at the main surface of said semiconductor substrate;

a base region of the first conductivity type formed at a surface of said impurity diffusion layer;

an emitter region of the second conductivity type formed at a surface of said base region;

an external base region of the first conductivity type connected to said base region, formed at the surface of said impurity diffusion layer, and surrounding said base region and said emitter region;

a pad conductive layer formed on said emitter region in contact with a surface of said emitter region;

an interlayer insulating layer formed on the main surface of said semiconductor substrate, and having first, second and third contact holes reaching a surface of said impurity diffusion layer, a surface of said external base region and a surface of said pad conductive layer, respectively; and first, second and third metal electrodes formed in said first, second and third contact holes, respectively, wherein the second metal electrode is in direct contact with a portion of a surface of the external base region, and the external base region and emitter region are formed in self-alignment.

2. The bipolar transistor according to claim 1, wherein a concentration of an impurity of the second conductivity type contained in said impurity diffusion layer located immediately under said base region is $5 \times 10^{18} \text{cm}^{-3}$ or less.

3. The bipolar transistor according to claim 1, wherein said semiconductor substrate is provided at the main surface with a groove surrounded by said external base region and extending in the depth direction of said semiconductor substrate through a portion of said external base region, a side wall insulating layer is formed on a side wall of said groove, said base region is formed immediately under a bottom surface of said groove, and a side end of said emitter region is located immediately under said side wall insulating layer.

4. The bipolar transistor according to claim 1, further comprising:

an insulating layer having an upper surface in contact with a side end of said pad conductive layer and a lower surface in contact with the main surface of said semiconductor substrate; and a sidewall insulating layer covering a side surface of said insulating layer and a sidewall of said pad conductive layer; wherein a side end of said emitter region is located immediately under said insulating layer, and one of ends of said external base region is located immediately under said side wall insulating layer.

5. A bipolar transistor comprising:

a semiconductor substrate of a first conductivity type having a main surface;

an impurity diffusion layer of a second conductivity type formed at the main surface of said semiconductor substrate;

a base region of the first conductivity type formed at a surface of said impurity diffusion layer;

an emitter region of the second conductivity type formed at a surface of said base region;

an external base region of the first conductivity type connected to said base region, formed at the surface of said impurity diffusion layer, and surrounding said base region and said emitter region;

a pad conductive layer formed on said emitter region in contact with a surface of said emitter region;

an interlayer insulating layer formed on the main surface of said semiconductor substrate, and having first, second and third contact holes reaching a surface of said impurity diffusion layer, a surface of said external base region and a surface of said pad conductive layer, respectively; and first, second and third metal electrodes formed in said first, second and third contact holes, respectively, wherein said semiconductor substrate is provided at the main surface with a concavity surrounded by said external base region, extending in the depth direction of said semiconductor substrate through a portion of said external base region and said concavity having a substantially half-elliptical section, an insulating layer integrally extending over said external base region and the bottom surface of said concavity and having an opening located on the bottom surface of said concavity is formed between the main surface of said semiconductor substrate and said interlayer insulating layer, said base region is formed immediately under the bottom surface of said concavity, and a side end of said emitter region is located immediately under said insulating layer near said opening.

6. A bipolar transistor comprising:

a semiconductor substrate of a first conductivity type having a main surface;

an impurity diffusion layer of a second conductivity type formed at the main surface of said semiconductor substrate;

a base region of the first conductivity type formed at a surface of said impurity diffusion layer, an emitter region of the second conductivity type formed at a surface of said base region;

an external base region of the first conductivity type connected to said base region, formed at the surface of said impurity diffusion layer, and surrounding said base region and said emitter region;

a pad conductive layer formed on said emitter region in contact with a surface of said emitter region;

an interlayer insulating layer formed on the main surface of said semiconductor substrate, and having first, second and third contact holes reaching a surface of said impurity diffusion layer, a surface of said external base region and a surface of said pad conductive layer, respectively; and first, second and third metal electrodes formed in said first, second and third contact holes, respectively, wherein said first metal electrode is in contact with a surface of said impurity diffusion layer, said second metal electrode is in contact with a surface of said external base region and said third metal electrode is in contact with a surface of said pad conductive layer;

said emitter region has a rectangular planar shape including a pair of opposed short sides;

said first metal electrode is disposed at a position opposed to the other of said short sides of said emitter region with a space from said emitter region; and said second metal electrode is disposed at a position opposed to the other of said short sides of said emitter region with a space from said emitter region.

7. A bipolar transistor comprising:

a semiconductor substrate of a first conductivity type having a main surface;

an impurity diffusion layer of a second conductivity type formed at the main surface of said semiconductor substrate;

a base region of the first conductivity type formed at a surface of said impurity diffusion layer;

an emitter region of the second conductivity type formed at a surface of said base region;

an external base region of the first conductivity type connected to said base region, formed at the surface of said impurity diffusion layer, and surrounding said base region and said emitter region;

a pad conductive layer formed on said emitter region in contact with a surface of said emitter region;

an interlayer insulating layer formed on the main surface of said semiconductor substrate, and having first, second and third contact holes reaching a surface of said impurity diffusion layer, a surface of said external base region and a surface of said pad conductive layer, respectively; and first, second and third metal electrodes formed in said first, second and third contact holes, respectively, wherein said first metal electrode is in contact with a surface of said impurity diffusion layer, said second metal electrode is in contact with a surface of said external base region and said third metal electrode is in contact with a surface of said pad conductive layer; and said first and second metal electrodes are disposed at neighboring positions, and said third metal electrode is disposed at a position opposed to both of said first and second metal electrodes.

8. A semiconductor device with a bipolar transistor comprising:

a semiconductor substrate of a first conductivity type having a main surface;

an MOS transistor having a pair of source/drain regions of the second conductivity type formed at the main surface of said semiconductor substrate;

an impurity diffusion layer of the second conductivity type formed at the main surface of said semiconductor substrate and spaced from said MOS transistor;

a base region of the first conductivity type formed at a surface of said impurity diffusion layer;

an external base region formed at the surface of said impurity diffusion layer and surrounding said base region;

a first groove formed to a depth in one of the source/drain regions;

an emitter region formed at a surface of said base region;

a second groove, having a death equal to the depth of the first groove, formed in the external base region such that the base region and the emitter region are directly beneath the second groove in the external base region; wherein a diffusion depth of said source/drain regions is larger than that of said external base region.

9. The semiconductor device with the bipolar transistor according to claim 8, wherein a concentration of an impurity of the second conductivity type contained in said impurity diffusion layer located immediately under said base region is $5 \times 10^{18}$ cm$^{-3}$ or less.

* * * * *